United States Patent
Lin et al.

(10) Patent No.: US 10,784,297 B2
(45) Date of Patent: Sep. 22, 2020

(54) CHIP SCALE PACKAGE STRUCTURES

(71) Applicant: Industrial Technology Research Institute, Hsinchu (TW)

(72) Inventors: Yu-Min Lin, Hsinchu County (TW); Tao-Chih Chang, Taoyuan (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 0 days.

(21) Appl. No.: 16/194,802

(22) Filed: Nov. 19, 2018

(65) Prior Publication Data
US 2019/0206916 A1    Jul. 4, 2019

(30) Foreign Application Priority Data
Dec. 28, 2017 (TW) .............................. 106146233 A

(51) Int. Cl.
*H01L 27/146* (2006.01)
*H01L 23/00* (2006.01)
*H01L 23/31* (2006.01)

(52) U.S. Cl.
CPC .... *H01L 27/14618* (2013.01); *H01L 23/3114* (2013.01); *H01L 23/3128* (2013.01); *H01L 24/09* (2013.01); *H01L 24/17* (2013.01); *H01L 24/29* (2013.01); *H01L 24/73* (2013.01); *H01L 27/14632* (2013.01); *H01L 27/14625* (2013.01); *H01L 27/14627* (2013.01); *H01L 2224/02373* (2013.01)

(58) Field of Classification Search
CPC ............... H01L 27/14618; H01L 24/29; H01L 23/3128; H01L 23/3114; H01L 24/73; H01L 24/09; H01L 24/17; H01L 27/14632; H01L 27/14625; H01L 2224/02373; H01L 27/14627
See application file for complete search history.

(56) References Cited

U.S. PATENT DOCUMENTS

| | | | |
|---|---|---|---|
| 6,204,562 B1 | 3/2001 | Ho et al. |
| 7,830,017 B2 | 11/2010 | Lee et al. |
| 8,241,954 B2 | 8/2012 | Camacho et al. |
| 8,466,997 B2 | 6/2013 | Goh et al. |
| 8,563,350 B2 | 10/2013 | Tu et al. |
| 8,828,802 B1 | 9/2014 | Park et al. |

(Continued)

FOREIGN PATENT DOCUMENTS

| | | |
|---|---|---|
| TW | I377630 B | 11/2012 |
| TW | 201521172 A | 6/2015 |
| TW | 201707199 A | 2/2017 |

*Primary Examiner* — Selim U Ahmed

(57) ABSTRACT

A chip scale package structure is provided. The chip scale package structure includes an image sensor chip and a chip. The image sensor chip includes a first redistribution layer including a conductive wire and a conductive pad formed on the conductive wire, wherein the conductive pad is exposed from the surface of the first redistribution layer. The chip includes a second redistribution layer including a conductive wire and a conductive pad formed on the conductive wire, wherein the conductive pad is exposed from the surface of the second redistribution layer. The area of the chip is smaller than that of the image sensor chip. The second redistribution layer of the chip bonds to the first redistribution layer of the image sensor chip.

12 Claims, 7 Drawing Sheets

(56) References Cited

U.S. PATENT DOCUMENTS

| | | | |
|---|---|---|---|
| 2013/0168851 A1* | 7/2013 | Lin | H01L 24/16 |
| | | | 257/737 |
| 2014/0055654 A1* | 2/2014 | Borthakur | H01L 27/14616 |
| | | | 348/302 |
| 2016/0086921 A1* | 3/2016 | Cho | H01L 25/50 |
| | | | 257/737 |
| 2018/0040584 A1* | 2/2018 | Kang | H01L 27/14634 |

* cited by examiner

CHIP SCALE PACKAGE STRUCTURES

CROSS REFERENCE TO RELATED APPLICATIONS

This Application claims priority of Taiwan Patent Application No. 106146233, filed on Dec. 28, 2017, the entirety of which is incorporated by reference herein.

TECHNICAL FIELD

The disclosure relates to a package structure, and more particularly to a chip scale package (CSP) structure.

BACKGROUND

A package process of a conventional image sensor module is based on a wire package or a chip scale package (CSP). For an image sensor module system, accessing and controlling data are still performed by means of a memory chip and a control chip. Therefore, an image sensor, a memory chip, and a control chip are usually assembled and integrated onto a system board. Communication between the memory chip, the control chip and the image sensor is carried out through the system board.

Recently, due to innovation of a process of an image sensor and drastically increased numbers of pixels, the demand for accessing and controlling huge amounts of data has been increased. Conventional methods of system integration are not enough to satisfy market trends. Therefore, an assembly technique has been developed that integrates various types of wafers such as image sensors/memory chips/logic chips in a "wafer-to-wafer" manner which greatly enhances the rate of electrical transmission and response of components. However, this technology still experiences bottlenecks. For now, "wafer-to-wafer" assembly technology is only suitable for small-sized sensors. The reason is that, although the chip spacing of the memory chip/logic chip can be adjusted as much as possible according to the distance between the image sensors, as the area of the sensors increases, the chip spacing of the memory chip/logic chip enlarges. In this case, the number of memory chips/logic chips per unit wafer area will be reduced, resulting in a substantial increase in the overall cost of the wafer.

Therefore, development of a low-cost chip scale package (CSP) structure with a high electrical transmission rate that is suitable for the fabrication of medium and large-sized sensors is desirable.

SUMMARY

In accordance with one embodiment of the disclosure, a chip scale package structure is provided. The chip scale package structure comprises an image sensor chip and a chip. The image sensor chip comprises a first redistribution layer comprising a conductive wire and a conductive pad formed on the conductive wire. The conductive pad is exposed from the surface of the first redistribution layer. The chip comprises a second redistribution layer comprising a conductive wire and a conductive pad formed on the conductive wire. The conductive pad is exposed from the surface of the second redistribution layer. The area of the chip is smaller than that of the image sensor chip. The second redistribution layer of the chip bonds to the first redistribution layer of the image sensor chip.

In accordance with another embodiment of the disclosure, a chip scale package structure is provided. The chip scale package structure comprises a first chip and a second chip. The first chip comprises a first redistribution layer comprising a conductive wire and a conductive pad formed on the conductive wire. The conductive pad is exposed from the surface of the first redistribution layer. The second chip comprises a second redistribution layer comprising a conductive wire and a conductive pad formed on the conductive wire. The conductive pad is exposed from the surface of the second redistribution layer. The area of the second chip is smaller than that of the first chip. The second redistribution layer of the second chip bonds to the first redistribution layer of the first chip.

A detailed description is given in the following embodiments with reference to the accompanying drawings.

BRIEF DESCRIPTION OF THE DRAWINGS

The present disclosure can be more fully understood by reading the subsequent detailed description and examples with references made to the accompanying drawings, wherein.

DETAILED DESCRIPTION

The following description is of the best-contemplated mode of carrying out the disclosure. This description is made for the purpose of illustrating the general principles of the disclosure and should not be taken in a limiting sense. The scope of the disclosure is best determined by reference to the appended claims.

Figure 1:
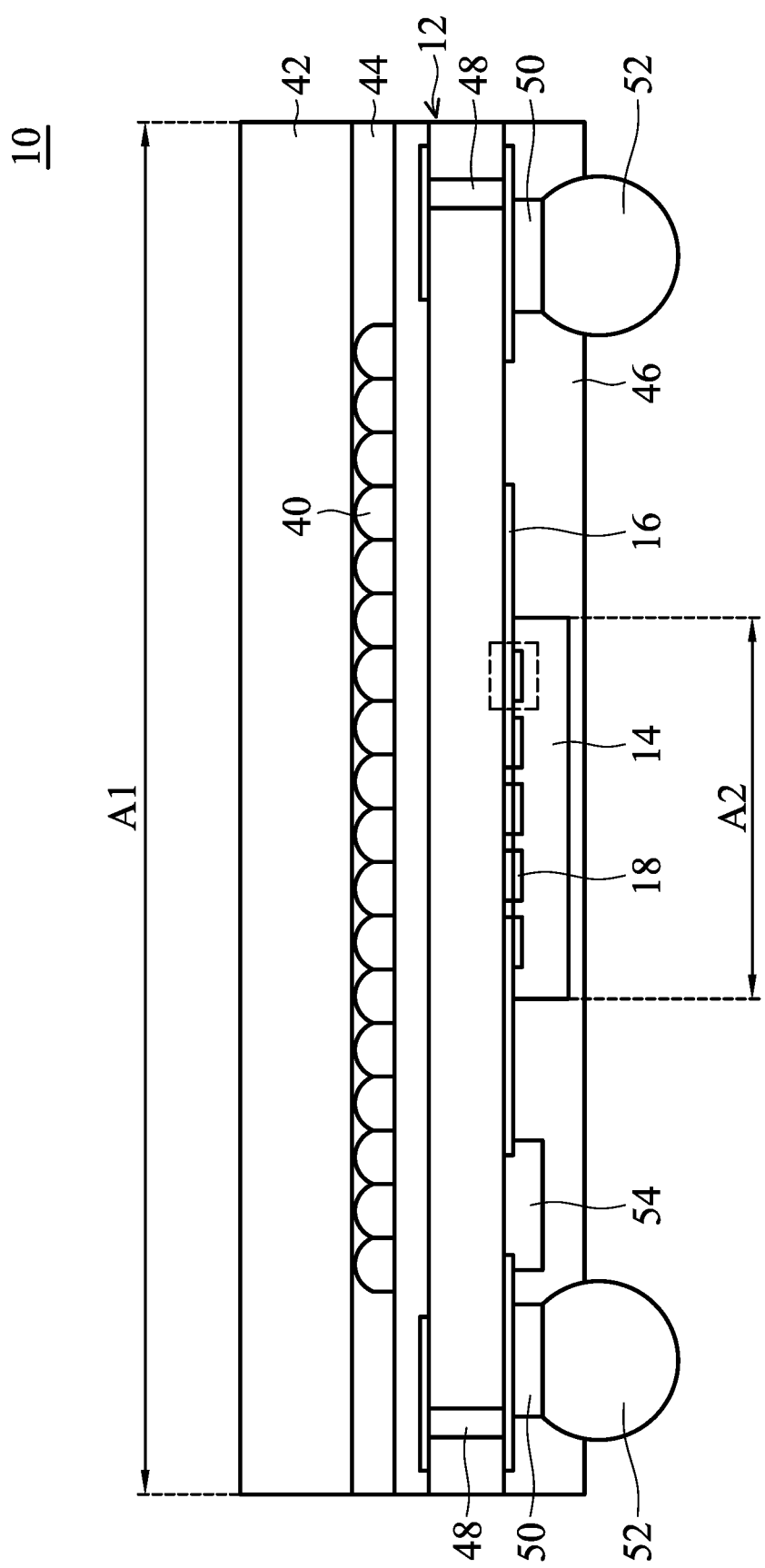
FIG. 1 is a cross-sectional view of a chip scale package structure in accordance with one embodiment of the disclosure.

Referring to FIG. 1, in accordance with one embodiment of the disclosure, a chip scale package (CSP) structure 10 is provided. FIG. 1 is a cross-sectional view of the chip scale package structure 10.

In this embodiment, the chip scale package (CSP) structure 10 may be a wafer level chip scale package (WLCSP), which comprises an image sensor chip 12 and a chip 14. The image sensor chip 12 comprises a first redistribution layer 16. The chip 14 comprises a second redistribution layer 18. The area A2 of the chip 14 is smaller than the area A1 of the image sensor chip 12. The internal structure of the first redistribution layer 16 and the second redistribution layer 18, and the bonding pattern between the image sensor chip 12 and the chip 14 (as indicated by the dotted line in the drawing) will be described in detail later.

In some embodiments, the image sensor chip 12 may also be replaced by other sensor chips, for example, acoustic sensor chips, temperature sensor chips, humidity sensor chips, gas sensor chips, pressure sensor chips, electrical sensor chips, magnetic sensor chips, image sensor chips, displacement sensor chips, or photo sensor chips.

In some embodiments, the chip 14 may be memory chips, logic chips, or other functional chips.

The package structure 10 of the present disclosure is applicable to huge signals or high-speed signal transmission that can be used, for example, in automotive electronics, handheld electronics, robot vision recognition, or high-resolution high-speed video recorders, but the present disclosure is not limited thereto.

Figure 2:
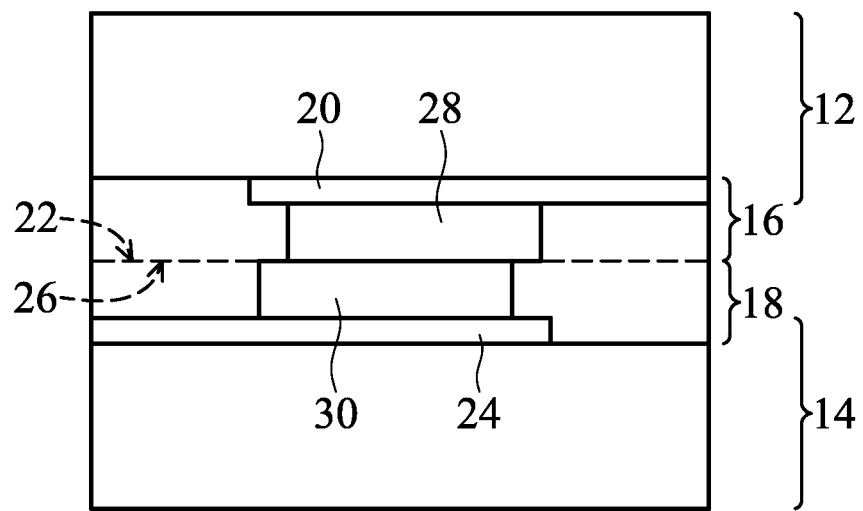
FIG. 2 is a cross-sectional enlarged view of a bonding pattern between a wafer and a chip in a chip scale package structure in accordance with one embodiment of the disclosure.

Referring to FIG. 2 (FIG. 2 is an enlarged view of the dotted box in FIG. 1), in accordance with one embodiment of the disclosure, the internal structure of the first redistribution layer 16 and the second redistribution layer 18, and a bonding pattern between the image sensor chip 12 and the chip 14 are disclosed. As shown in FIG. 2, the first redistribution layer 16 comprises a conductive wire 20, a conductive pad 28 and a protection layer overlying the conductive wire 20. The conductive pad 28 is formed on the conductive wire 20. The conductive pad 28 is exposed from a surface 22 of the first redistribution layer 16. The second redistribution layer 18 comprises a conductive wire 24, a conductive pad 30 and a protection layer overlying the conductive wire 24. The conductive pad 30 is formed on the conductive wire 24. The conductive pad 30 is exposed from a surface 26 of the second redistribution layer 18. In some embodiments, the conductive wires (20 and 24) and the conductive pads (28 and 30) may comprise copper. The conductive pad 30 exposed from the second redistribution layer 18 of the chip 14 bonds to the conductive pad 28 exposed from the first redistribution layer 16 of the image sensor chip 12 to form a Cu—Cu bonding.

In some embodiments, the roughness (Ra) of the surface 22 of the first redistribution layer 16 is about less than 1 nm. In some embodiments, the roughness (Ra) of the surface 26 of the second redistribution layer 18 is about less than 1 nm.

Figure 3:
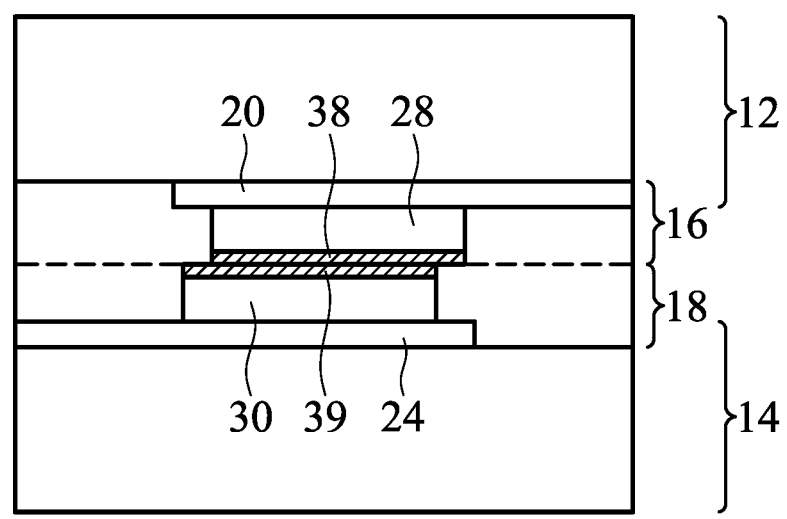
FIG. 3 is a cross-sectional enlarged view of a bonding pattern between a wafer and a chip in a chip scale package structure in accordance with one embodiment of the disclosure.

Referring to FIG. 3 (FIG. 3 is an enlarged view of the dotted box in FIG. 1), in accordance with one embodiment of the disclosure, a bonding pattern between the image sensor chip 12 and the chip 14 is disclosed. As shown in FIG. 3, a first metal layer 38 is further formed between the conductive pad 30 of the second redistribution layer 18 and the conductive pad 28 of the first redistribution layer 16. In some embodiments, the first metal layer 38 may comprise gold, tin, cobalt, manganese, titanium, palladium, nickel, silver or an alloy thereof, but the present disclosure is not limited thereto. In some embodiments, a first metal layer 38 and a second metal layer 39 are further formed between the conductive pad 30 of the second redistribution layer 18 and the conductive pad 28 of the first redistribution layer 16, wherein the first metal layer 38 is formed on the conductive pad 28 of the first redistribution layer 16, and the second metal layer 39 is formed on the conductive pad 30 of the second redistribution layer 18.

Still referring to FIG. 1, in this embodiment, a plurality of microlenses 40 are further formed on the image sensor chip 12, opposite to the first redistribution layer 16. In this embodiment, a transparent capping layer 42 is further formed on the microlenses 40. In some embodiments, the transparent capping layer 42 may comprise glass or other appropriate materials, which is used to protect the underlying components and effectively promote the penetration or gain of signals. In this embodiment, an adhesive layer 44 is further formed between the image sensor chip 12 and the transparent capping layer 42, overlying the microlenses 40. In some embodiments, the adhesive layer 44 may comprise any appropriate organic adhesive material.

Figure 4:
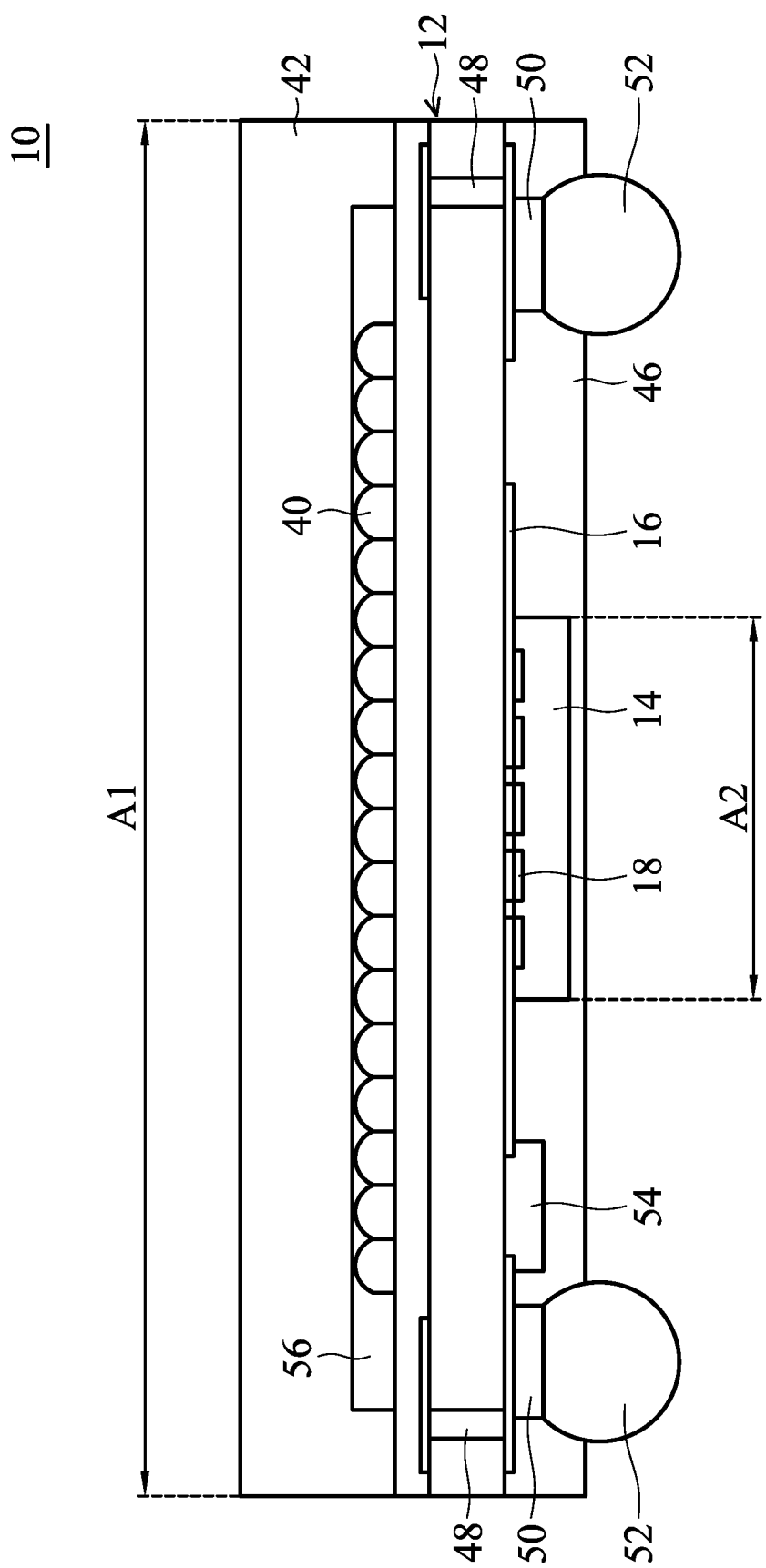
FIG. 4 is a cross-sectional view of a chip scale package structure in accordance with one embodiment of the disclosure.

In some embodiments, an enclosed space 56 is further formed between the image sensor chip 12 and the transparent capping layer 42, accommodating the microlenses 40, as shown in FIG. 4.

Still referring to FIG. 1, in this embodiment, an insulating protection layer 46 is further formed on the image sensor chip 12, overlying the chip 14. In some embodiments, the insulating protection layer 46 may comprise any appropriate molding insulating material.

In this embodiment, an interconnection 48 is further formed in the image sensor chip 12 to electrically connect each component (not shown) in the image sensor chip 12 and the first redistribution layer 16. In this embodiment, a plurality of metal pads 50 are further formed on the first redistribution layer 16, exposing from the insulating protection layer 46. In some embodiments, the metal pads 50 may comprise aluminum, copper, nickel, aluminum copper alloy, or aluminum silicon copper alloy. In this embodiment, a plurality of conductive balls 52 are further formed to connect to the metal pads 50. In some embodiments, the package structure 10 of the present disclosure may further bond to a substrate (not shown) by the conductive balls 52. In some embodiments, the substrate bonded to the package structure 10 may comprise a silicon substrate, a ceramic substrate, a glass fiber substrate, a printed circuit board, or other system boards that meet the requirements of the process.

In this embodiment, a plurality of bump structures 54 are further formed on the image sensor chip 12, assembled around the chip 14 through glue or metal contacts. The bump structure 54 may further suppress the warping phenomenon of the package structure 10. In one embodiment, the bump structure 54 may include a functional chip which is located around the chip 14 (e.g., at one side or both sides of the chip 14 or around the chip 14) to integrate various functional chips in the package structure 10 and further suppress the warping phenomenon of the package structure 10. In some embodiments, the functional chip may be memory chips or logic chips, but the present disclosure is not limited thereto.

In accordance with one embodiment of the present disclosure, a functional chip (such as a memory chip or a logic chip) is directly bonded to a sensor chip using the assembly technique of "chip on wafer" and the copper-copper direct bonding method (e.g., solderless interconnection). Such a chip bonding method enables arrangement and selection of the functional chips to become more flexible, capable of effectively reducing and controlling the overall fabrication cost, and is quite suitable for the fabrication of medium and large-sized sensors. In addition, the electrical transmission rate between the functional chips and the sensor chips is also significantly increased due to the short copper-copper direct bonding path.

Figure 5:
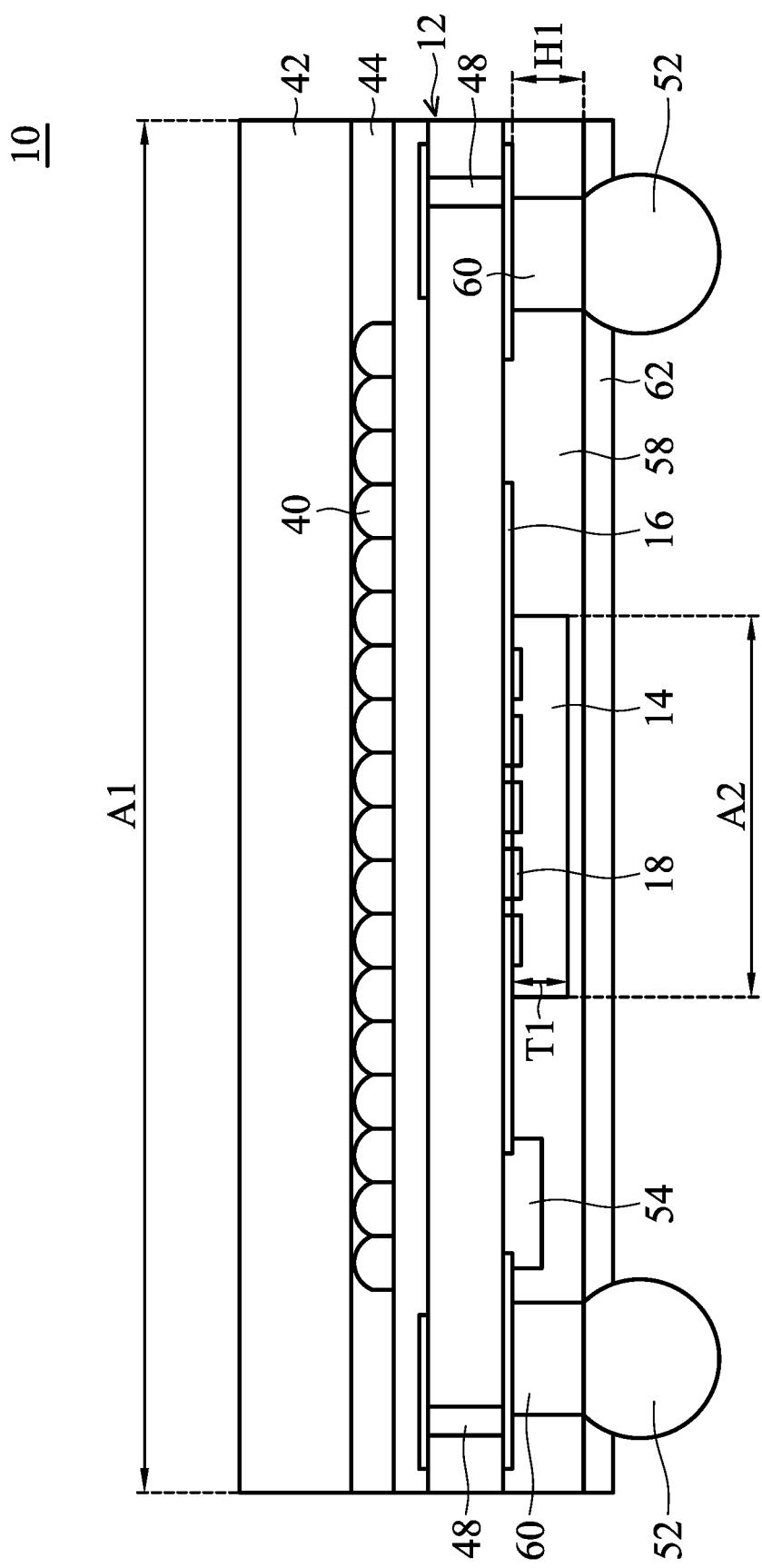
FIG. 5 is a cross-sectional view of a chip scale package structure in accordance with one embodiment of the disclosure.

Referring to FIG. 5, in accordance with one embodiment of the disclosure, a chip scale package (CSP) structure 10 is provided. FIG. 5 is a cross-sectional view of the chip scale package structure 10.

In this embodiment, the chip scale package (CSP) structure 10 comprises an image sensor chip 12 and a chip 14. The image sensor chip 12 comprises a first redistribution layer 16. The chip 14 comprises a second redistribution layer 18. The area A2 of the chip 14 is smaller than the area A1 of the image sensor chip 12.

In some embodiments, the image sensor chip 12 may also be replaced by other sensor chips, for example, acoustic sensor chips, temperature sensor chips, humidity sensor chips, gas sensor chips, pressure sensor chips, electrical sensor chips, magnetic sensor chips, image sensor chips, displacement sensor chips, or photo sensor chips.

In some embodiments, the chip 14 may be memory chips, logic chips, or other functional chips.

The internal structure of the first redistribution layer 16 and the second redistribution layer 18, and the bonding patterns between the image sensor chip 12 and the chip 14 are referred to FIGS. 2 and 3.

In this embodiment, a plurality of microlenses 40 are further formed on the image sensor chip 12, opposite to the first redistribution layer 16. In this embodiment, a transparent capping layer 42 is further formed on the microlenses 40. In some embodiments, the transparent capping layer 42 may comprise glass or other appropriate materials, which is used to protect the underlying components and effectively promote the penetration or gain of signals. In this embodiment, an adhesive layer 44 is further formed between the image sensor chip 12 and the transparent capping layer 42, overlying the microlenses 40. In some embodiments, the adhesive layer 44 may comprise any appropriate organic adhesive material.

Figure 6:
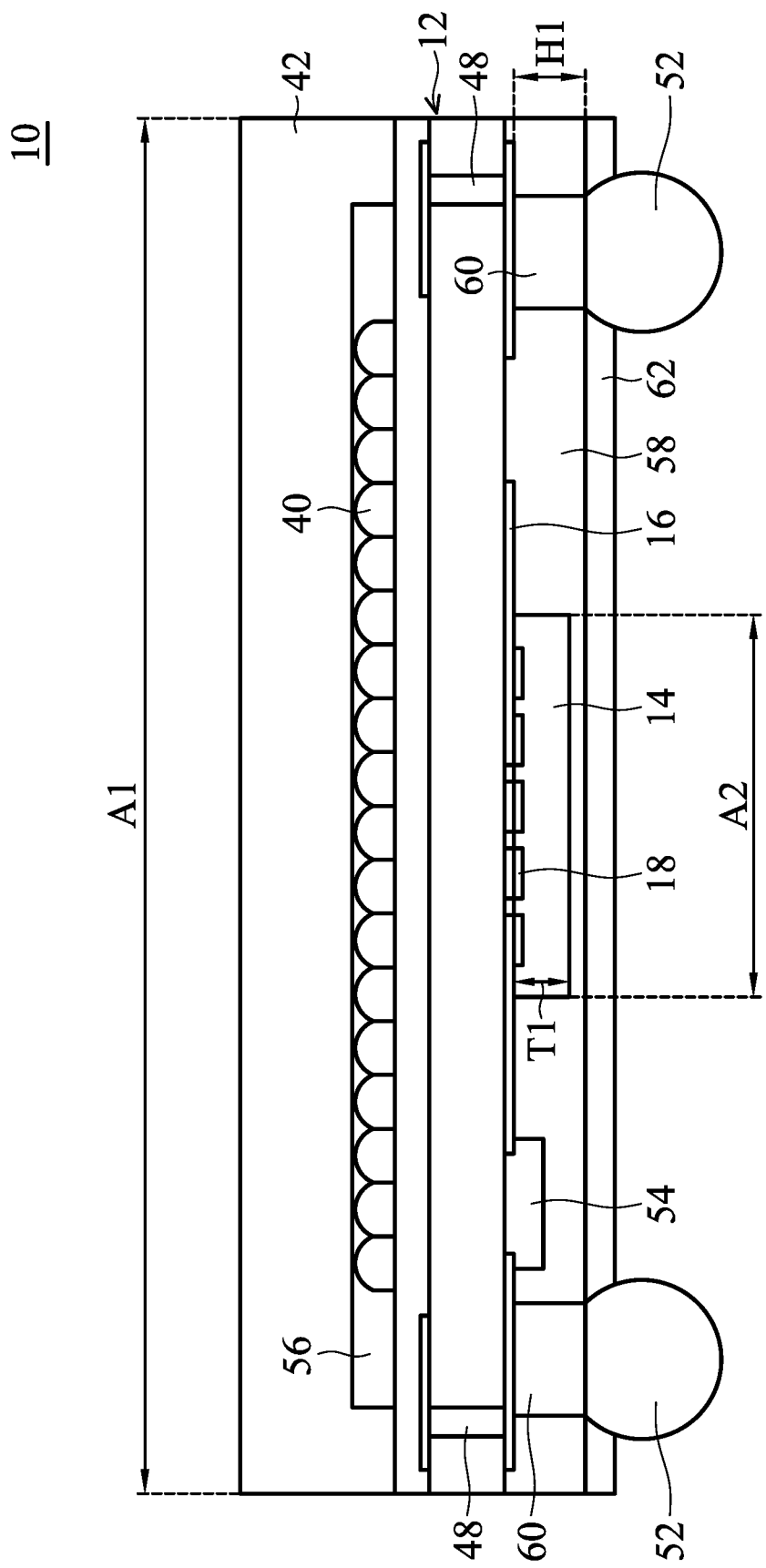
FIG. 6 is a cross-sectional view of a chip scale package structure in accordance with one embodiment of the disclosure.

In some embodiments, an enclosed space 56 is further formed between the image sensor chip 12 and the transparent capping layer 42, accommodating the microlenses 40, as shown in FIG. 6.

Still referring to FIG. 5, in this embodiment, a molding material layer 58 is further formed on the image sensor chip 12, overlying the chip 14. In some embodiments, the molding material layer 58 may comprise any appropriate insulating material.

In this embodiment, an interconnection 48 is further formed in the image sensor chip 12 to electrically connect each component (not shown) in the image sensor chip 12 and the first redistribution layer 16. In this embodiment, a plurality of metal conductive pillars 60 are further formed on the first redistribution layer 16, passing through the molding material layer 58 and exposing therefrom. In some embodiments, the metal conductive pillars 60 may comprise copper or other appropriate metals. In some embodiments, the height H1 of the metal conductive pillars 60 is larger than the thickness T1 of the chip 14. In some embodiments, a protection layer 62 is further formed on the molding material layer 58, exposing the metal conductive pillars 60. In some embodiments, the protection layer 62 may comprise any appropriate insulating material. In this embodiment, a plurality of conductive balls 52 are further formed to connect to the metal conductive pillars 60. In some embodiments, the package structure 10 of the present disclosure may further bond to a substrate (not shown) by the conductive balls 52. In some embodiments, the substrate bonded to the package structure 10 may comprise a silicon substrate, a ceramic substrate, a glass fiber substrate, a printed circuit board, or other system boards that meet the requirements of the process.

Figure 7:
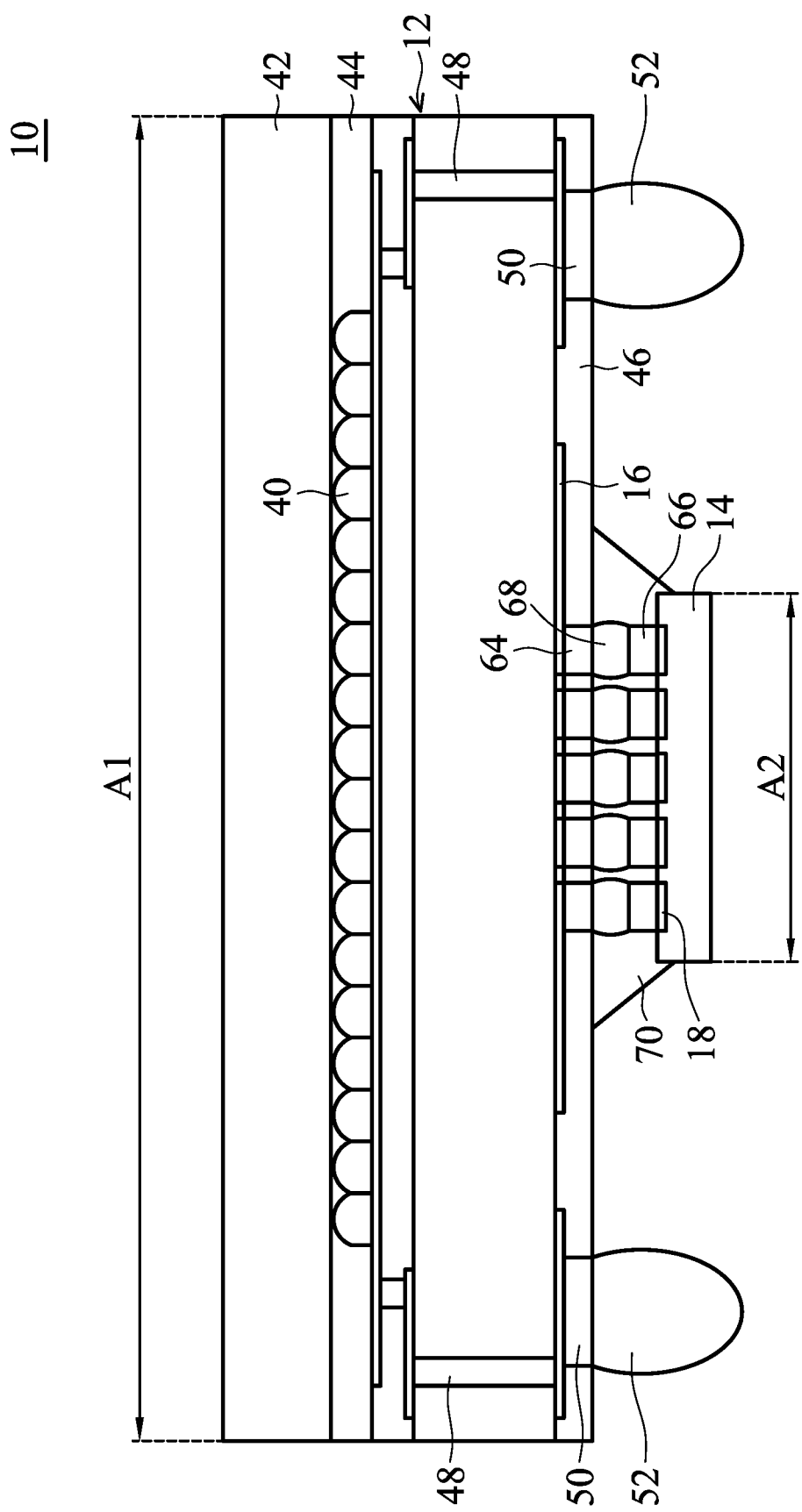
FIG. 7 is a cross-sectional view of a chip scale package structure in accordance with one embodiment of the disclosure.

Referring to FIG. 7, in accordance with one embodiment of the disclosure, a chip scale package (CSP) structure 10 is provided. FIG. 7 is a cross-sectional view of the chip scale package structure 10.

In this embodiment, the chip scale package (CSP) structure 10 comprises an image sensor chip 12 and a chip 14. The image sensor chip 12 comprises a first redistribution layer 16. The chip 14 comprises a second redistribution layer 18. The area A2 of the chip 14 is smaller than the area A1 of the image sensor chip 12.

In some embodiments, the image sensor chip 12 may also be replaced by other sensor chips, for example, acoustic sensor chips, temperature sensor chips, humidity sensor chips, gas sensor chips, pressure sensor chips, electrical sensor chips, magnetic sensor chips, image sensor chips, displacement sensor chips, or photo sensor chips.

In some embodiments, the chip 14 may be memory chips, logic chips, or other functional chips.

The bonding pattern between the image sensor chip 12 and the chip 14 is described as follows.

As shown in FIG. 7, a plurality of first copper bumps 64 are further formed on the first redistribution layer 16 of the image sensor chip 12. A plurality of second copper bumps 66 are further formed on the second redistribution layer 18 of the chip 14. A plurality of solder balls 68 are further formed between the first copper bumps 64 and the second copper bumps 66. The chip 14 is bonded to the image sensor chip 12 through the second copper bumps 66, the solder balls 68 and the first copper bumps 64 to form a copper-solder ball-copper bonding pattern.

In this embodiment, a plurality of microlenses 40 are further formed on the image sensor chip 12, opposite to the first redistribution layer 16. In this embodiment, a transparent capping layer 42 is further formed on the microlenses 40. In some embodiments, the transparent capping layer 42 may comprise glass or other appropriate materials, which is used to protect the underlying components and effectively promote the penetration or gain of signals. In this embodiment, an adhesive layer 44 is further formed between the image sensor chip 12 and the transparent capping layer 42, overlying the microlenses 40. In some embodiments, the adhesive layer 44 may comprise any appropriate organic adhesive material.

In some embodiments, an enclosed space (not shown) is further formed between the image sensor chip 12 and the transparent capping layer 42, accommodating the microlenses 40.

In this embodiment, an insulating protection layer 46 is further formed on the image sensor chip 12. In some embodiments, the insulating protection layer 46 may comprise any appropriate dielectric insulating material. In this embodiment, an underfill 70 is further filled between the insulating protection layer 46 and the chip 14.

In this embodiment, an interconnection 48 is further formed in the image sensor chip 12 to electrically connect each component (not shown) in the image sensor chip 12 and the first redistribution layer 16. In this embodiment, a plurality of metal pads 50 are further formed on the first redistribution layer 16, exposing from the insulating protection layer 46. In some embodiments, the metal pads 50 may comprise aluminum, copper, nickel, aluminum copper alloy, or aluminum silicon copper alloy. In this embodiment, a plurality of conductive balls 52 are further formed to connect to the metal pads 50. In some embodiments, the package structure 10 of the present disclosure may further bond to a substrate (not shown) by the conductive balls 52. In some embodiments, the substrate bonded to the package structure 10 may comprise a silicon substrate, a ceramic substrate, a glass fiber substrate, a printed circuit board, or other system boards that meet the requirements of the process.

Figure 8:
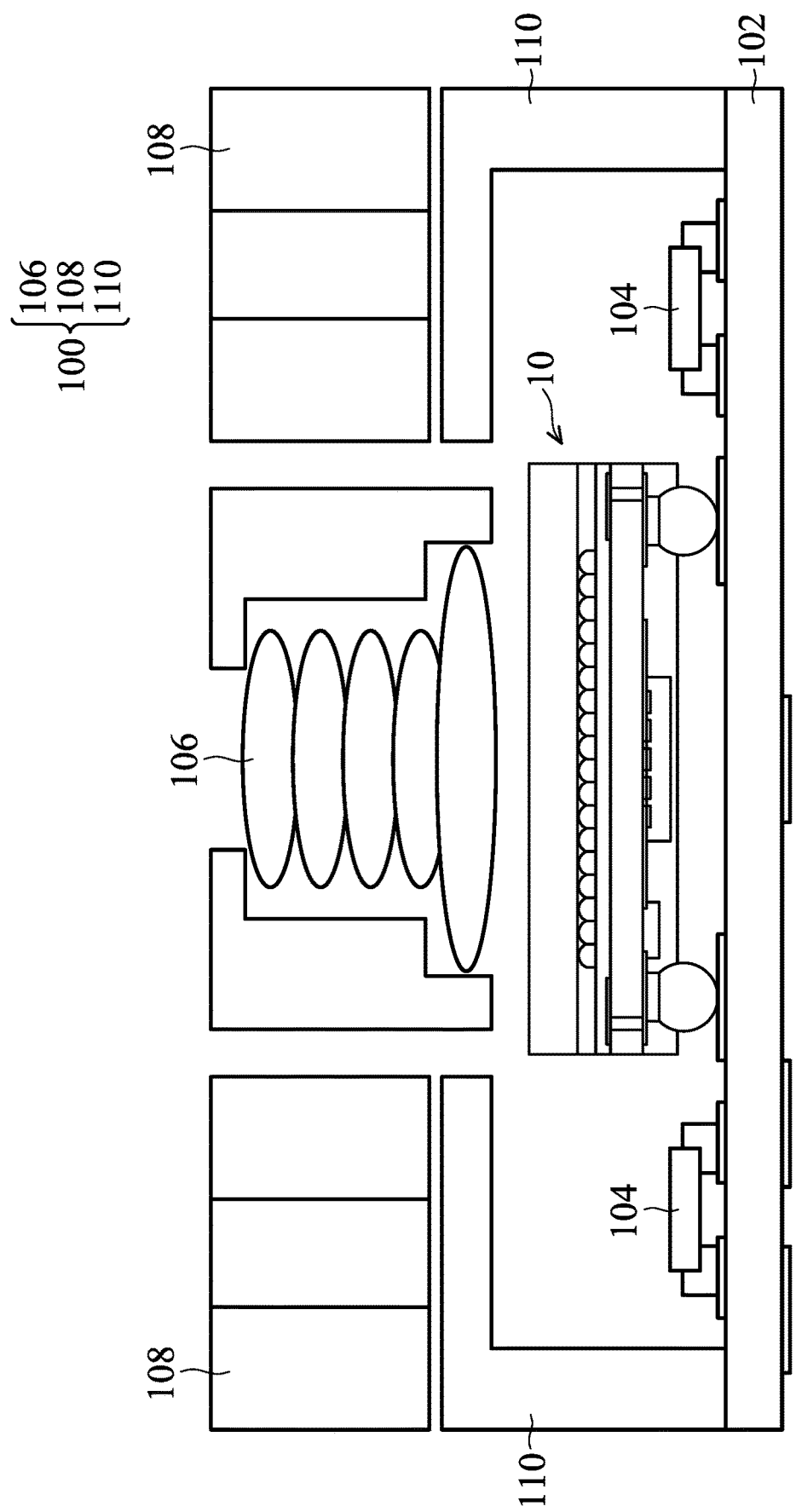
FIG. 8 is a cross-sectional view of a chip scale package structure combined with a lens module in accordance with one embodiment of the disclosure.

Referring to FIG. 8, in accordance with one embodiment of the disclosure, a structure of a chip scale package (CSP)

structure 10 combed with a lens module 100 is provided. FIG. 8 is a cross-sectional view of the chip scale package structure 10 combed with the lens module 100.

As shown in FIG. 8, the chip scale package (CSP) structure 10 is bonded to the substrate 102. Also, the lens module 100 is bonded to the substrate 102 together.

In some embodiments, the chip scale package (CSP) structure 10 bonded to the substrate 102 may comprise the package structures as shown in FIGS. 1, 4, 5, 6 and 7.

In some embodiments, the substrate 102 may comprise a silicon substrate, a ceramic substrate, a glass fiber substrate, a printed circuit board, or other system boards that meet the requirements of the process. In this embodiment, a plurality of active (or passive) components 104 are further formed on the substrate 102. The lens module 100 comprises a lens 106, an actuator 108 and a lens base 110.

In accordance with one embodiment of the present disclosure, the chip scale package structure and the lens module are simultaneously embedded on the substrate, so that the image sensor chip in the package structure forms an improved coplanar with the lens which effectively solves the possible skew phenomenon between the image sensor chip and the lens. Also, in the package structure, the signal transmission path between the image sensor chip and other functional chips (such as a memory chip or a logic chip) is shorten due to the copper-copper bonding pattern between the two chips, substantially increasing in computing speed.

While the disclosure has been described by way of example and in terms of preferred embodiment, it is to be understood that the disclosure is not limited thereto. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A chip scale package structure, comprising:
   an image sensor chip comprising a first redistribution layer comprising a conductive wire and a conductive pad formed on the conductive wire, wherein the conductive pad is exposed from a surface of the first redistribution layer;
   a chip comprising a second redistribution layer comprising a conductive wire and a conductive pad formed on the conductive wire, wherein the conductive pad is exposed from a surface of the second redistribution layer, wherein an area of the chip is smaller than that of the image sensor chip, and the second redistribution layer of the chip bonds to the first redistribution layer of the image sensor chip;
   a molding material layer formed on the image sensor chip, overlying the chip; and
   a plurality of metal conductive pillars formed on the first redistribution layer, passing through the molding material layer and being exposed therefrom.

2. The chip scale package structure as claimed in claim 1, wherein the conductive wire and the conductive pad comprise copper.

3. The chip scale package structure as claimed in claim 1, wherein the conductive pad exposed from the second redistribution layer of the chip bonds to the conductive pad exposed from the first redistribution layer of the image sensor chip.

4. The chip scale package structure as claimed in claim 3, further comprising a first metal layer formed between the conductive pad of the second redistribution layer and the conductive pad of the first redistribution layer.

5. The chip scale package structure as claimed in claim 3, further comprising a first metal layer and a second metal layer, wherein the first metal layer is formed on the conductive pad of the first redistribution layer, and the second metal layer is formed on the conductive pad of the second redistribution layer.

6. The chip scale package structure as claimed in claim 1, further comprising a plurality of microlenses formed on the image sensor chip, opposite to the first redistribution layer.

7. The chip scale package structure as claimed in claim 6, further comprising a transparent capping layer formed on the microlenses.

8. The chip scale package structure as claimed in claim 7, further comprising an adhesive layer formed between the image sensor chip and the transparent capping layer, overlying the microlenses.

9. The chip scale package structure as claimed in claim 7, further comprising an enclosed space formed between the image sensor chip and the transparent capping layer, containing the microlenses.

10. The chip scale package structure as claimed in claim 1, further comprising a plurality of conductive balls connected to the metal conductive pillars.

11. The chip scale package structure as claimed in claim 1, further comprising a plurality of bump structures formed on the image sensor chip, located at one or both sides of the chip or around the chip.

12. A chip scale package structure, comprising:
   a first chip comprising a first redistribution layer comprising a conductive wire and a conductive pad formed on the conductive wire, wherein the conductive pad is exposed from a surface of the first redistribution layer;
   a second chip comprising a second redistribution layer comprising a conductive wire and a conductive pad formed on the conductive wire, wherein the conductive pad is exposed from a surface of the second redistribution layer, wherein an area of the second chip is smaller than that of the first chip, and the second redistribution layer of the second chip bonds to the first redistribution layer of the first chip;
   a molding material layer formed on the first chip, overlying the second chip; and
   a plurality of metal conductive pillars formed on the first redistribution layer, passing through the molding material layer and being exposed therefrom.

* * * * *